United States Patent [19]

Nakano

[11] Patent Number: 5,541,544
[45] Date of Patent: Jul. 30, 1996

[54] BIPOLAR FLIP-FLOP CIRCUIT WITH IMPROVED NOISE IMMUNITY

[75] Inventor: Toshiya Nakano, Itami, Japan

[73] Assignee: Mitsubishi Denki Kabushiki Kaisha, Tokyo, Japan

[21] Appl. No.: 307,464

[22] Filed: Sep. 19, 1994

[30] Foreign Application Priority Data

Sep. 24, 1993 [JP] Japan ................................. 5-237864

[51] Int. Cl.$^6$ ......................... H03K 3/286; H03K 17/16
[52] U.S. Cl. ......................... 327/217; 327/198; 327/219; 327/379
[58] Field of Search ................................. 327/198, 215, 327/217, 218, 219, 202, 220, 222, 223, 199, 378, 379, 382, 538, 540; 326/31, 33; 257/903

[56] References Cited

U.S. PATENT DOCUMENTS

| | | | |
|---|---|---|---|
| 3,066,231 | 11/1962 | Slobodzinsk et al. | 327/217 |
| 3,430,070 | 2/1969 | Marshall, Jr. et al. | 327/217 |
| 3,700,930 | 10/1972 | Gonzalez | 327/220 |
| 3,731,119 | 5/1973 | Matzen | 327/215 |
| 3,818,462 | 6/1974 | Anselmo et al. | 327/215 |
| 3,914,622 | 10/1975 | Pezzolo | 327/198 |
| 4,642,552 | 2/1987 | Suzuki et al. | 323/315 |
| 4,782,467 | 11/1988 | Belt et al. | 307/279 |
| 4,785,341 | 11/1988 | Ning et al. | 257/903 |
| 4,791,315 | 12/1988 | Gontowski, Jr. | 327/220 |
| 4,868,420 | 9/1989 | Itoh et al. | 307/441 |
| 4,996,445 | 2/1991 | Lin | 327/223 |
| 5,029,323 | 7/1991 | Nakazato et al. | 257/903 |
| 5,144,158 | 9/1992 | Kanai et al. | 327/218 |
| 5,304,861 | 4/1994 | Fruhauf et al. | 307/296.4 |
| 5,357,144 | 10/1994 | Tanaka | 327/198 |

FOREIGN PATENT DOCUMENTS

| | | | |
|---|---|---|---|
| 3164608 | 7/1988 | Japan | 327/198 |
| 63-246023 | 10/1988 | Japan . | |
| 2026123 | 1/1990 | Japan | 327/203 |
| 6006186 | 1/1994 | Japan | 327/198 |

Primary Examiner—Timothy P. Callahan
Assistant Examiner—Eunja Shin
Attorney, Agent, or Firm—Leydig, Voit & Mayer

[57] ABSTRACT

A semiconductor integrated bipolar flip-flop circuit prevents or suppresses erroneous operation arising from a current induced by external noise and flowing through a parasitic capacitance associated with a p-type diffused resistor. The semiconductor integrated circuit includes bipolar transistors that are directly involved with set and reset operations of the flip-flop circuit having bases connected to a two-stage inverter including bipolar transistors so that the bases of the bipolar transistors involved in setting and resetting are not connected directly to a p-type diffused resistor.

3 Claims, 6 Drawing Sheets

BIPOLAR FLIP-FLOP CIRCUIT WITH IMPROVED NOISE IMMUNITY

BACKGROUND OF THE INVENTION

1. Field of the Invention

The present invention relates to a semiconductor integrated circuit including a bipolar-type flip-flop circuit, and, particularly, to a technique to prevent erroneous operation of a flip-flop circuit due to external noise.

2. Description of the Related Art

Bipolar-type flip-flop circuits are used in various applications. In this description, here, there will be described a specific application of a flip-flop circuit to a control circuit used in an apparatus installed in a car or a motorcycle. In this application, the flip-flop circuit is often affected by ignition noise due to sparks of an ignition plug.

FIG. 9 is a circuit diagram illustrating a conventional semiconductor integrated circuit called a flip-flop circuit for use in a control circuit of an antilock brake system (hereafter referred to as an ABS) installed in a car or a motorcycle. In this flip-flop circuit 10 shown in FIG. 9, a reset operation takes precedence over a set operation. The flip-flop circuit 10 comprises: constant current sources I3, I6, I7 (I3, I6, I7 are also used to denote the values of currents supplied by these current sources); bipolar transistors (hereafter referred to simply as transistors) Q3, Q4, Q7, Q8, and Q9; and resistors R3, R4, R5 and R6. In FIG. 9, there are also shown a set terminal Set, a reset terminal Reset, an output terminal OUT, a power supply Vcc, and ground GND. In this flip-flop circuit 10, the flip-flop circuit is set or reset by a combination of transistors Q3, Q4, Q7, and Q8 to provide a Q signal and an inverted-Q (denoted by Q with an overline in FIG. 9 and other figures) signal. The Q signal is inverted by an inverter composed of the transistor Q9, and output via the output terminal OUT as an inverted-Q output signal. Resistors R3 and R4 are balance resistors for equally supplying the Q signal to bases of both transistors Q4 and Q9. Similarly, resistors R5 and R6 are balance resistors for supplying a set signal equally to the base of the transistor Q3 and the base of a transistor (not shown) in another block.

This circuit is used as one of the flip-flops included in a circuit that generates a signal when a failure is detected in a control motor (not shown) of an ABS. This signal is sent to a controller such as a microcomputer (not shown) responsible for control of the entire ABS so as to stop the antilock brake control and switch the control to a normal brake control mode. The set terminal receives for example, a failure signal generated by a sensor (not shown) for detecting overheating of the control motor or by a circuit (not shown) for detecting an overcurrent of the control motor. In response to this failure signal, a signal is provided to the microcomputer of the ABS via the output terminal OUT so as to stop the antilock brake control. One flip-flop circuit of this type is provided for each of failure signals of the overheating sensor of the motor, overcurrent detection circuit, etc.

The flip-flop circuit shown in FIG. 9 operates as follows.

In the following explanation, there will be shown an example in which the flip-flop circuit receives a failure signal from the overcurrent detection circuit for detecting a failure of the control motor of the ABS. Therefore, it is assumed that the set terminal is connected to the output of the overcurrent detection circuit, and the output terminal OUT is connected to an input of microcomputer of the ABS.

In a normal state, when no failure is detected, the set terminal connected to the overcurrent detection circuit is at an L-level. Just after the power supply of the system is turned on, a reset signal having an H-level is applied to the reset terminal. After that, however, the reset terminal is maintained at an L-level. In this state, transistors Q3, Q4, Q8, and Q9 are in an off-state, and the transistor Q7 is in an on-state. As a result, the Q signal is at an L-level and the output terminal OUT or the inverted-Q output is at an H-level. That is, in a normal state, an H-level signal is applied to the microcomputer.

If the overcurrent detection circuit detects an overcurrent flowing through the motor, an H-level signal is applied to the set terminal. As a result, the transistor Q3 is turned on, and thus the inverted-Q signal falls down to an L-level, and this causes the transistor Q7 to be turned off. As a result, the Q signal goes to an H-level, and transistors Q4 and Q9 are turned on, and thus the inverted-Q output at the output terminal OUT goes to an L-level. In this way, a signal indicating that a failure or an overcurrent has occurred is sent to the microcomputer. In response to this signal, the microcomputer stops the antilock brake control and switches the control to the normal brake control mode.

In the flip-flop circuit configured in the above-described manner, when a huge surge (ignition noise in this case) occurs on the Vcc power supply line or the GND line, a current flows for a short time through the parasitic capacitance of a semiconductor substrate (described later) into the bases of the transistors Q3 and Q4, which sometimes causes the flip-flop to operate in an erroneous manner (to perform an erroneous latching operation). This erroneous operation will be described in more detail below.

FIG. 10 is a cross-sectional view of the semiconductor substrate 100 on which resistors R3 through R6 shown in FIG. 9 are formed as p-type diffused resistor, while only one of those resistors is illustrated in FIG. 10. In FIG. 10, reference numeral 1 denotes a resistor acting as one of resistors shown in FIG. 9, that is formed in an n-type epitaxial layer 3 (called an island) surrounded by p(p+)-type diffused region 2 called an isolation-diffused region. In an actual integrated circuit, a plurality of resistors 1 are formed in this epitaxial layer 3. The epitaxial layer 3, in which the resistor 1 is formed, should be maintained at a stable voltage higher than the voltage of the resistor 1 so that the resistor 1 is reverse-biased thereby isolating the resistor 1. For this reason, the voltage of the epitaxial layer 3 is generally fixed to the power supply voltage Vcc. Reference numeral 3a denotes a terminal for connecting the epitaxial layer 3 to the power supply.

While a reverse bias voltage is applied between the resistor 1 and the epitaxial layer 3 for isolation, there are still small parasitic capacitances 4 as represented by broken lines in FIG. 10. These parasitic capacitances correspond to capacitors 4a–4d of the flip-flop circuit shown in FIG. 9. In general, when a pn junction is reverse-biased, there is a junction capacitance acting as a parasitic capacitance. If the fluctuation of the power supply voltage Vcc or the GND voltage is large, these parasitic capacitances 4 cause the flip-flop circuit to operate in an erroneous fashion.

Semiconductor integrated circuits installed in a car or a motorcycle are affected by ignition noise due to sparks of an ignition plug. FIG. 11A illustrates a waveform associated with the inverted-Q output at the output terminal OUT of the circuit shown in FIG. 9, in which erroneous inversion due to ignition noise is shown. FIG. 11B illustrates a waveform associated with the power supply voltage Vcc subjected to ignition noise. In FIG. 11B, V represents a voltage swing of 10 V and T represents a time period of 4 μs. As shown in FIG. 11A, the inverted-Q output is inverted from an H-level to an L-level due to ignition noise. That is, if the power supply Vcc or the GND is subjected to huge surge noise such as ignition noise, a current flows for a short time through parasitic capacitances of the semiconductor substrate into the bases of the transistors Q3, Q4 (refer to FIG. 9), which sometimes results in erroneous operation.

It can be understood that the erroneous operation occurs as follows.

(a) In a normal state, both set and reset signals are at an L-level, and the Q signals is at an L-level and the inverted-Q signal is at an H-level. Thus, the transistors Q3, Q4, and Q8 are in an off-state, and the transistor Q7 is in an on-state.

(b) In this state, if external noise such as ignition noise enters the circuit, fluctuations occur in the power supply voltage Vcc or the GND voltage.

(c) As a result, a current flows through the parasitic capacitance 4a or 4b from the power supply Vcc to the resistor R3 or R5 as shown in FIG. 9. Thus, a current flows into the base of the transistor Q3 or Q4. If the amount of this current reaches several tenths or several hundredths of the collector current of the same transistor, the transistor Q3 or Q4 can be turned on. For example, if I3 is assumed to be 50 μA, then a current of several μA flowing into the base of the transistor Q3 or Q4 can turn on the transistor.

(d) In the above-described manner, the flip-flop circuit is set, and inverted-Q output is inverted from the H-level to an L-level. While this inversion is not due to a true set signal, a signal indicating an event of a failure is sent to the microcomputer of the ABS. As a result, the ABS stops the antilock brake control, and switches the control to the normal brake control mode.

In the above example, erroneous set operation of the system has been described. However, the system may also be reset erroneously in a similar manner.

What is a really serious problem here is that a transistor is for example turned on from an off-state due to noise and latched in this on-state. However, fluctuations that occur for a short time without leading to latching do not bring about any serious problems.

As described above, conventional semiconductor integrated circuits including a bipolar-type flip-flop circuit configured in the above-described manner have a problem that external noise can bring about erroneous operations.

SUMMARY OF THE INVENTION

It is an object of the present invention to solve the above problem. More specifically, it is an object of the present invention to provide a semiconductor integrated circuit that prevents or suppresses erroneous operations due to noise.

According to a first aspect of the present invention, there is provided a semiconductor integrated circuit including a flip-flop circuit with bipolar-type transistors comprising: a set/reset circuit section for generating a Q output signal and an inverted-Q output signal, the set/reset circuit section including a plurality of transistors that perform either a set operation or a reset operation of the flip-flop circuit; and erroneous operation suppressing means for suppressing erroneous operation of a transistor due to noise entering the base of the transistor, wherein, among the plurality of transistors of the set/reset section, the transistor whose erroneous operation is to be suppressed is such that a transistor has its base connected to a signal output having a fan-out of at least two whereby the transistor is latched in either an on-state or an off-state.

According to a second aspect of the present invention that is based on the first aspect, there is provided a semiconductor integrated circuit in which the erroneous operation suppressing means is a two-stage bipolar-transistor inverter circuit disposed between the base of the transistor and a balance resistor connected to the signal output having the fan-out of at least two.

According to a third aspect of the present invention that is based on the first aspect, there is provided a semiconductor integrated circuit in which the erroneous operation suppressing means is accomplished in such a manner that, among the transistors, transistors having bases receiving the same signal are formed in areas adjacent to each other on a semiconductor substrate so that balance resistors become unnecessary.

According to a fourth aspect of the present invention that is based on the first aspect, there is provided a semiconductor integrated circuit in which the erroneous operation suppressing means comprises a turn on suppressing element for suppressing turning-on of the transistor having a base connected to a signal output having a fan-out of at least two wherein the transistor is latched in either an on-state or an off-state.

According to a fifth aspect of the present invention that is based on the fourth aspect, there is provided a semiconductor integrated circuit in which the turning-on suppressing element comprises a capacitor for absorbing a noise current, the capacitor being connected either between the base and the emitter of the transistor or between the base and the collector of the transistor.

According to a sixth aspect of the present invention that is based on the fourth aspect, there is provided a semiconductor integrated circuit in which the turn on suppressing element comprises a level-shift diode for increasing a logic threshold level associated with the transistor thereby acquiring greater resistance to noise, the level-shift diode being connected to the base of the transistor having a grounded emitter.

According to a seventh aspect of the present invention that is based on the fourth aspect, there is provided a semiconductor integrated circuit, in which the turn on suppressing element is a leakage reducing resistor for suppressing a noise current flowing into the transistor, the leakage reducing resistor being connected between the base and the emitter of the transistor.

According to an eighth aspect of the present invention that is based on the first aspect, there is provided a semiconductor integrated circuit in which the erroneous operation suppressing means comprises a stabilized voltage source connected to a power supply terminal formed in an n-type epitaxial layer on a semiconductor substrate wherein a resistor of the flip-flop circuit is formed as a p-type diffused resistor in the n-type epitaxial layer, thereby stabilizing the power supply voltage including fluctuations and thus suppressing a noise current entering through a parasitic capacitance associated with the p-type diffused resistor.

According to a ninth aspect of the present invention that is based on the first aspect, there is provided a semiconductor integrated circuit in which the erroneous operation suppressing means includes: a balance resistor connected between the emitter of a transistor and ground; and a level-shift diode connected to the collector output of the transistor, the level-shift diode ensuring that the succeeding stage may be turned off even when the emitter of the transistor is at a floating potential.

According to a tenth aspect of the present invention that is based on the first aspect, there is provided a semiconductor integrated circuit, in which the erroneous operation suppressing means is accomplished in such a manner that a current flowing through the collector of a transistor of the flip-flop circuit has a large value relative to a noise current whereby the transistor acquires greater resistance to noise.

The semiconductor integrated circuit according to the first aspect of the present invention has erroneous operation suppressing means for suppressing an erroneous operation of a transistor due to noise entering the base of the transistor. Among a plurality of transistors that are involved with a set/reset operation, the above erroneous operation suppressing means is provided for transistors whose bases are connected to a signal output having a fan-out of at least two wherein the transistors ace latched in either an on-state or an off-state, whereby undesirable erroneous operations are avoided.

In the semiconductor integrated circuit of the second aspect based on the first aspect of the invention, the erroneous operation suppressing means is a two-stage bipolar-transistor inverter circuit disposed between the base of the transistor and a balance resistor connected to the signal output having a fan-out of at least two. In this semiconductor integrated circuit, the balance resistor formed of a p-type diffused resistor is not connected directly to the base, so that a noise current cannot easily flow through a parasitic capacitance associated with the p-type diffused resistor into the base of the transistor. Thus, erroneous operations are prevented.

In the semiconductor integrated circuit of the third aspect based on the first aspect of the present invention, transistors having bases receiving the same signal are formed in areas adjacent to each other on a semiconductor substrate so as to minimize the variation in forward voltage VF among the transistors whereby balance resistors become unnecessary.

In the semiconductor integrated circuit of the fourth aspect based on the first aspect of the present invention, the erroneous operation suppressing means is accomplished using the turn on suppressing element for suppressing turning-on of the transistor having its base connected to a signal output having a fan-out of at least two wherein the transistor is latched in either an on-state or an off-state.

In the semiconductor integrated circuit of the fifth aspect based on the fourth aspect of the present invention, a capacitor is used as the turning-on suppressing element for absorbing a noise current, wherein the capacitor is connected either between the base and the emitter of the transistor or between the base and the collector of the transistor.

In the semiconductor integrated circuit of the sixth aspect based on the forth aspect of the present invention, a level-shift diode is used as the turn on suppressing element wherein the level-shift diode is connected to the base of the transistor whose emitter is grounded so as to increase a logic threshold level associated with the transistor thereby acquiring greater resistance to noise.

In the semiconductor integrated circuit of the seventh aspect based on the fourth aspect of the present invention, a leakage reducing resistor is used as the turning-on suppressing element wherein the leakage reducing resistor is connected between the base and the emitter of the transistor thereby suppressing a noise current flowing into the transistor.

In the semiconductor integrated circuit of the eighth aspect based on the first aspect of the present invention, the erroneous operation suppressing means comprises a stabilized voltage source connected to a power supply terminal formed in an n-type epitaxial layer on a semiconductor substrate wherein a resistor of the flip-flop circuit is formed as a p-type diffused resistor in the n-type epitaxial layer, thereby stabilizing a power supply voltage including a fluctuations and thus suppressing a noise current entering through a parasitic capacitance associated with the p-type diffused resistor. The stabilized voltage source may be implemented for example, by one diode or a plurality of diodes connected in series.

In the semiconductor integrated circuit of the ninth aspect based on the first aspect of the present invention, the erroneous operation suppressing means includes: a balance resistor connected between the emitter of a transistor and ground; and a level-shift diode connected to the collector output of the transistor. The level-shift diode ensures that the succeeding stage may be turned off even when the emitter of the transistor is at a floating potential.

In the semiconductor integrated circuit of the tenth aspect based on the first aspect of the present invention, the erroneous operation suppressing means is accomplished in such a manner that a current flowing through the collector of a transistor of the flip-flop circuit is set to a large value relative to a noise current whereby the transistor acquires greater resistance to noise.

DESCRIPTION OF THE PREFERRED EMBODIMENTS

Referring to the accompanying drawings, embodiments of the present invention will be described.

EMBODIMENT 1

Figure 1:
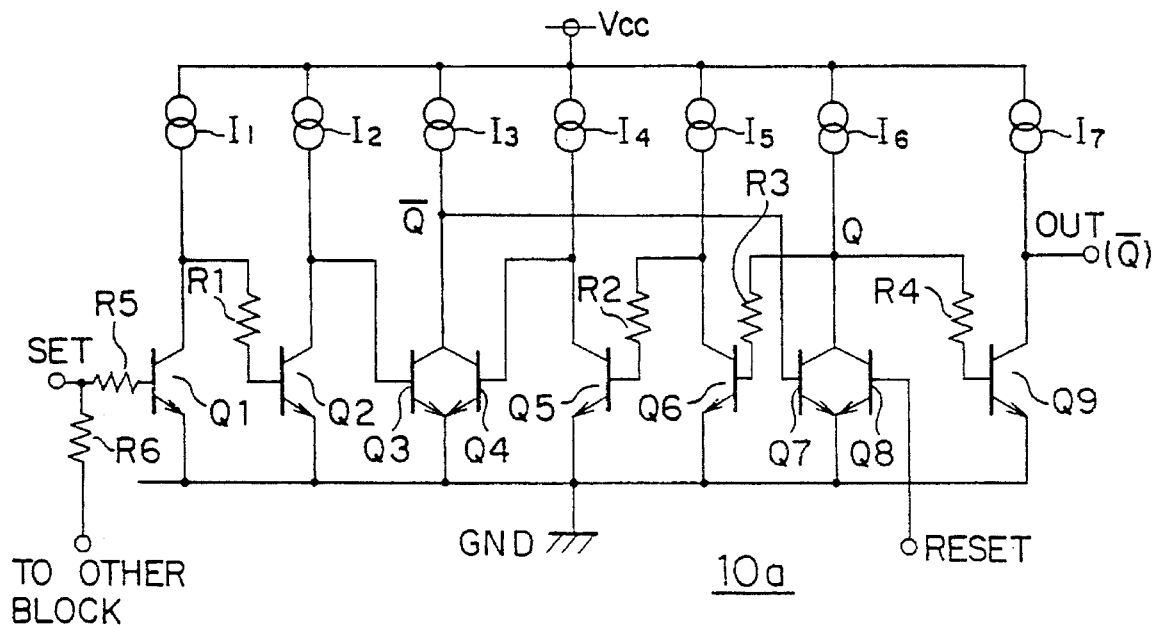
FIG. 1 is a circuit diagram of a first embodiment of a semiconductor integrated circuit of a flip-flop circuit according to the present invention.
Figure 9:
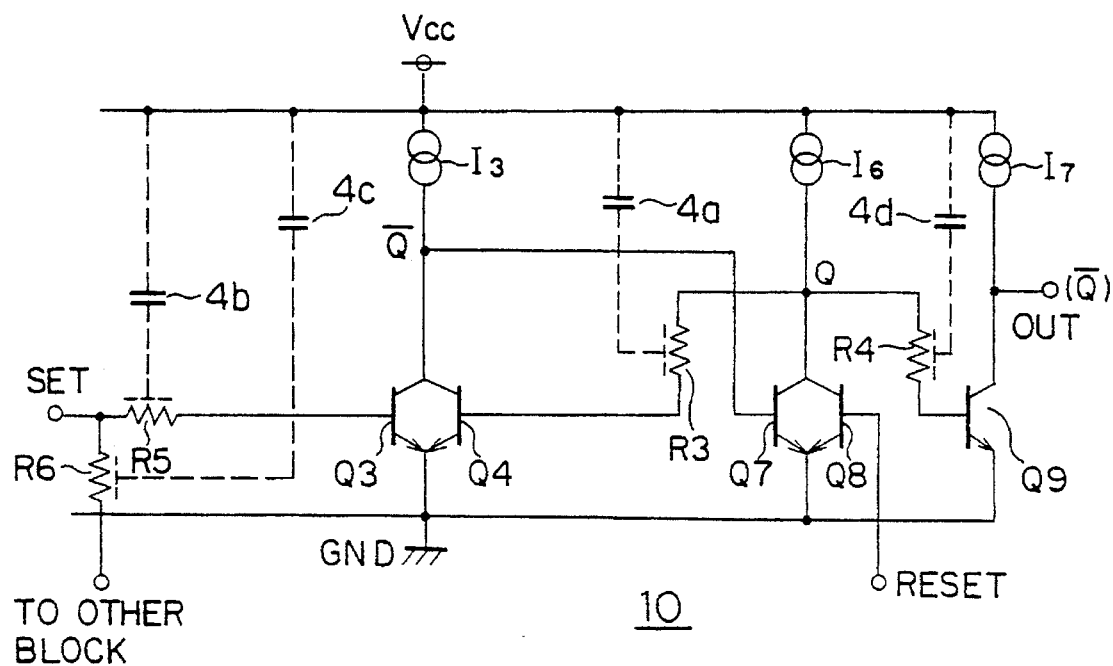
FIG. 9 is a circuit diagram of a conventional semiconductor integrated circuit of a flip-flop circuit.

FIG. 1 is a circuit diagram of a first embodiment of a semiconductor integrated bipolar flip-flop circuit according to the present invention. In this figure, elements similar to or corresponding to those in FIG. 9 are denoted by similar reference characters.

In this flip-flop circuit 10a shown in FIG. 1, a reset operation also takes precedence over a set operation. The flip-flop circuit 10a includes: constant current sources I1–I7 (I1–I7 are also used to denote the values of currents supplied by these current sources); bipolar transistors Q1–Q9, each emitter of which is grounded; and resistors R1–R6. Among transistors Q1–Q9, transistors: Q3, Q4, Q7, and Q8 are involved with at least either a D-set operation or a reset operation in the flip-flop circuit. The transistor Q9 forming an inverter inverts the Q signal and provides an inverted-Q signal at the output terminal OUT. The transistors Q1 and Q2 form a two-stage inverter whose output is connected to the base of the transistor Q3. Similarly, the transistor Q5 and Q6 form a two-stage inverter whose output is connected to the base of the transistor Q4. Resistors R3 and R4 are balance resistors for providing the Q signal equally to bases of both transistors Q4 and Q9. Similarly, resistors R5 and R6 are balance resistors for transferring a signal applied to the set terminal equally to the base of the transistor Q1 and the base of a transistor in another block (not shown).

In this flip-flop circuit 10a, a two-stage inverter is connected to each of the bases of the transistors Q3 and Q4 that perform set and reset operations, respectively, so that a resistor formed of a p-type diffused area is not connected directly to the base of the transistor Q3 or Q4. The resistors R1 and R2 (formed as p-type diffused resistors) connected to the bases of the transistors Q2 and Q5 of the inverters are connected to the transistors Q3 or Q4 prevent the transistors Q3 and Q4 from being easily turned on.

This circuit operates as follows.

First, the circuit shown in FIG. 1 is assumed to be in a normal state in which both set signal and reset signal are at an L-level, and the Q signal is at an L-level and the inverted-Q signal is at an H-level. In this state, if the power supply voltage Vcc or the GND voltage is disturbed by noise to a great extent, currents flow through parasitic capacitances (refer to FIGS. 9 and 10) from the power supply to p-type diffused resistors as in the case of the conventional circuit described above. However, because the bases of the transistors Q3, Q4, Q7, and Q8 that are directly involved with the set or reset operation of the flip-flop circuit are not connected directly to the p-type diffused resistors, these transistors Q3, Q4, Q7, and Q8 are not turned on due to noise even for a very short time. Therefore, erroneous operations do not occur in the flip-flop circuit. Since, the bases of the transistors Q2 and Q5 are connected to the transistors Q3 and Q4, respectively, and are connected to the resistors R1 and R2, p-type diffused resistors, these transistors Q2 and Q5 can be turned on due to noise. However, turning on of these transistors Q2 and Q5 has an effect opposite to the turning on of the transistors Q3 and Q4. As a result, the flip-flop circuit has greater resistance to noise.

In this circuit, as described above, what is a really serious problem that is solved according to the present invention is that a transistor is turned on from an off-state due to noise and latched in the on-state. Fluctuations that occur for a short time without leading to latching do not bring about any problems.

The Q signal line is connected indirectly to the base of the transistor Q4 for the following two reasons.

(1) First, balance resistors are required since the Q signal has a fan-out of two, that is, the Q signal is connected to two transistors Q4 and Q9. (In general, when the fan-out is greater than two, it is desirable to have balance resistors for providing equal signal distributions. Otherwise, variations in forward voltage VF among transistors may produce imbalance in base current among these transistors, which may further cause the base current to be concentrated in a certain transistor. As a result, transistors that should be turned on cannot be turned on.)

However, as discussed above, it is not desirable to connect the Q signal to the base of the transistor Q4 via a direct connection of a balance resistor. Therefore, the two-stage inverter including transistors Q5 and Q6 is added to the circuit so that a p-type diffused resistor is not connected directly to the base of the transistor Q4.

(2) Second, sometimes, it is impossible to design a circuit pattern on a semiconductor substrate such that the line between the Q-signal and the base of the transistor Q4 has no cross-over (a portion at which two interconnections cross each other). Thus, if a resistor R3 is used for a cross-over, a two-stage inverter is also added to the circuit. In a semiconductor substrate such as that shown in FIG. 10, the interconnection pattern is usually made of aluminum. Therefore, if interconnections are crossed directly, these are short-circuited. To avoid this problem, a p-type diffused resistor is commonly used as a jumper for one of interconnections at a cross-over portion as long as the p-type diffused resistor brings about no other serious problems in the circuit operation. When the resistor R3 is such a resistor, a two-stage inverter is required. (If the cross-over portion is formed using an n-type diffused resistor, this second reason will be minor, and the major reason will be the first one in this case.)

For a similar reason, a two-stage inverter is formed using transistors Q1 and Q2.

On the other hand, since the transistors Q7 and Q8 are connected to respective preceding stages each having a fan-out of one, no two-stage inverter is provided for these transistors.

EMBODIMENT 2

Figure 2:
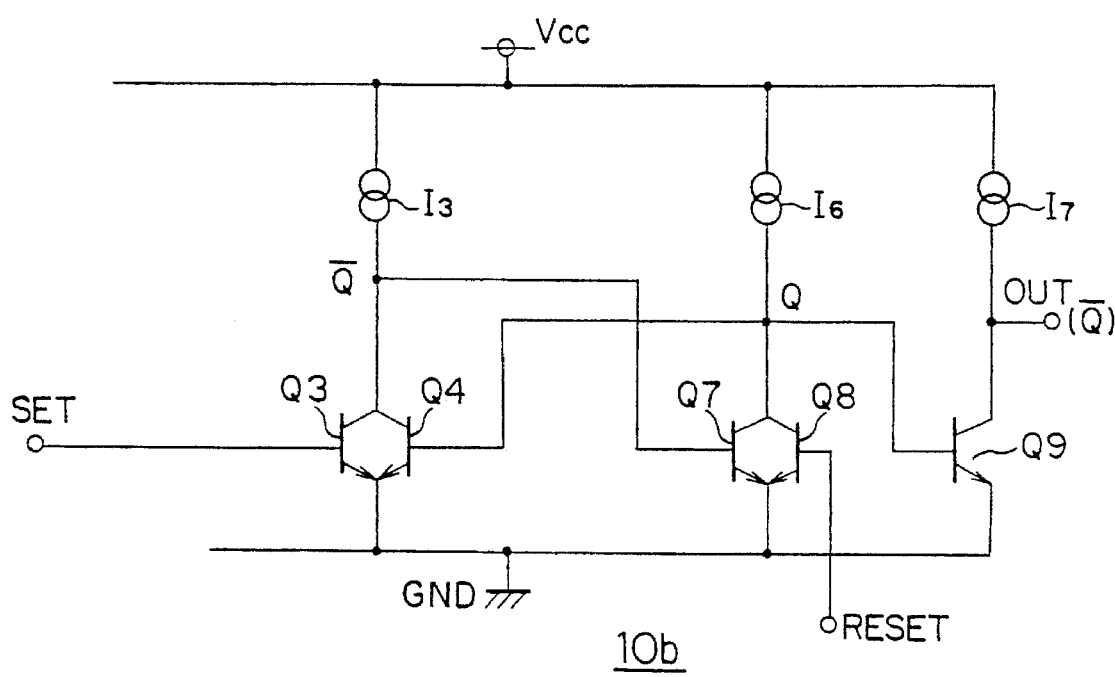
FIG. 2 is a circuit diagram of a second embodiment of a semiconductor integrated circuit of a flip-flop circuit according to the present invention.

FIG. 2 is a circuit diagram of a second embodiment of a semiconductor integrated bipolar flip-flop circuit according to the present invention. In this embodiment of the flip-flop circuit 10b, the number of components is reduced by removing the two-stage inverters connected to the bases of the transistors Q3 and Q4 of the circuit shown in FIG. 10a. The Q signal has a fan-out of two, that is, the Q signal is connected to both transistors Q4 and Q9. These transistors Q4 and Q9 are located in areas adjacent to each other on a semiconductor substrate so that the difference in forward voltage VF between these transistors Q4 and Q9 is reduced to a sufficiently small level to eliminate balance resistors and thus to avoid two-stage inverters.

In this example shown in FIG. 2, the Q signal line has a fan-out of two. However, this technique may also be applied to the case where the fan-out is at least three.

EMBODIMENT 3

Figure 3:
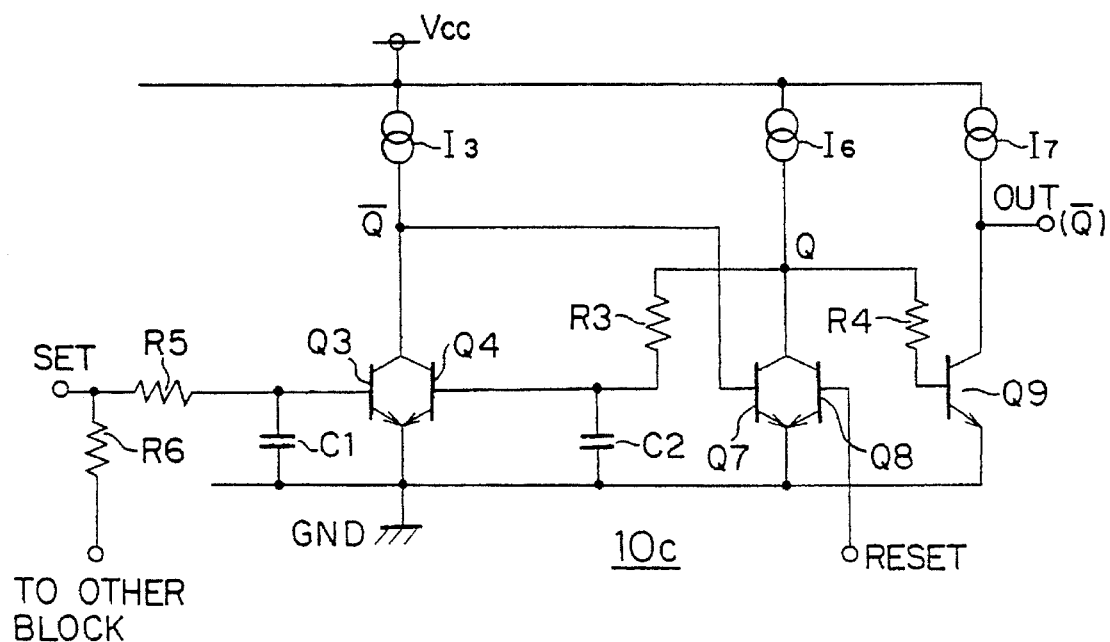
FIG. 3 is a circuit diagram of a third embodiment of a semiconductor integrated circuit of a flip-flop circuit according to the present invention.

FIG. 3 is a circuit diagram of a third embodiment of a semiconductor integrated bipolar flip-flop circuit according to the present invention. This embodiment of the flip-flop circuit 10c differs from the conventional flip-flop circuit 10 shown in FIG. 9 in that, among transistors Q3, Q4, Q7, and Q8 that are directly involved with at least either set or reset operation of the flip-flop circuit, the transistors Q3 and Q4 whose bases are connected to p-type diffused resistors R3 and R5, respectively, have capacitors C1 and C2 connected between respective bases and emitters so as to suppress turning on of these transistors. These capacitors (by-pass capacitors) C1 and C3 may be MOS-type capacitors, junction capacitors, or nitride film capacitors each formed on a semiconductor substrate. Alternatively, these capacitors may also be provided as external capacitors separate from the semiconductor substrate. In this embodiment, capacitors C1 and C2 absorb noise currents, and therefore these noise currents cannot easily reach the transistor Q3 or Q4.

EMBODIMENT 4

Figure 4:
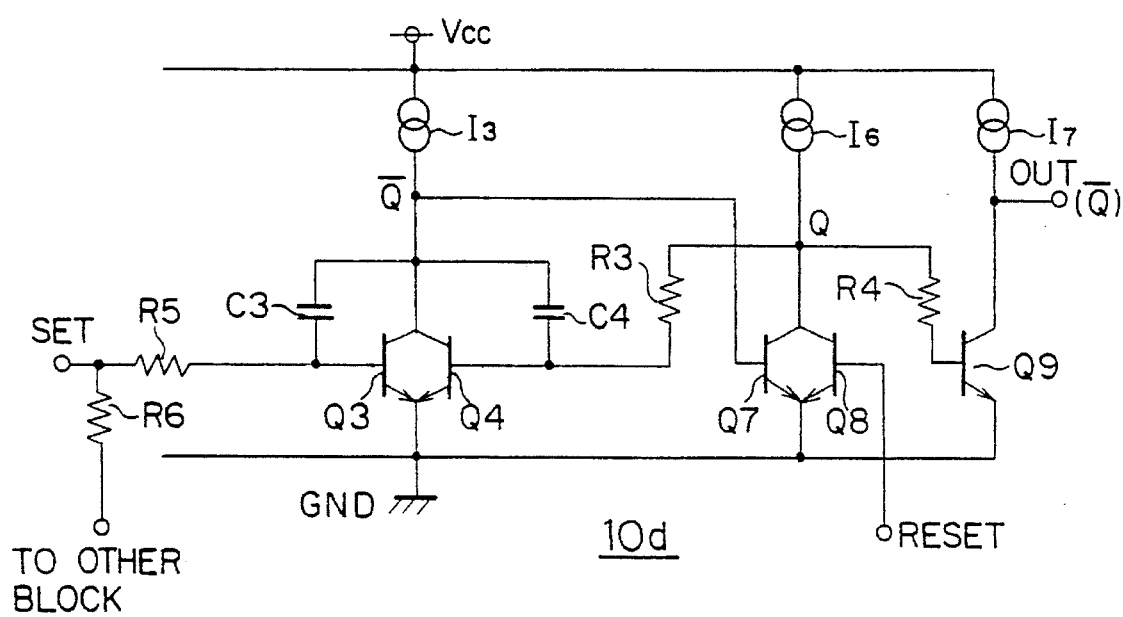
FIG. 4 is a circuit diagram of a fourth embodiment of a semiconductor integrated circuit of a flip-flop circuit according to the present invention.

FIG. 4 is a circuit diagram of a fourth embodiment of a flip-flop circuit according to the present invention. Unlike the third embodiment of the flip-flop circuit 10c shown in FIG. 3, the fourth embodiment of the flip-flop circuit 10d has capacitors C3 and C4 connected between each collector and base of respective transistors Q3 and Q4. Since this circuit configuration exhibits the Miller effect, capacitances smaller than those used in the circuit of FIG. 3 can be used. In theory, if the current gain hFE of each transistor Q3, and Q4 is, for example 100, then the capacitance of each capacitor C3, and C4 may be one hundredth of that required for the case where capacitors are connected between each base and emitter of respective transistors Q3 and Q4 as shown in FIG. 3. This allows a reduction in the area on the substrate required for each capacitor.

EMBODIMENT 5

Figure 5:
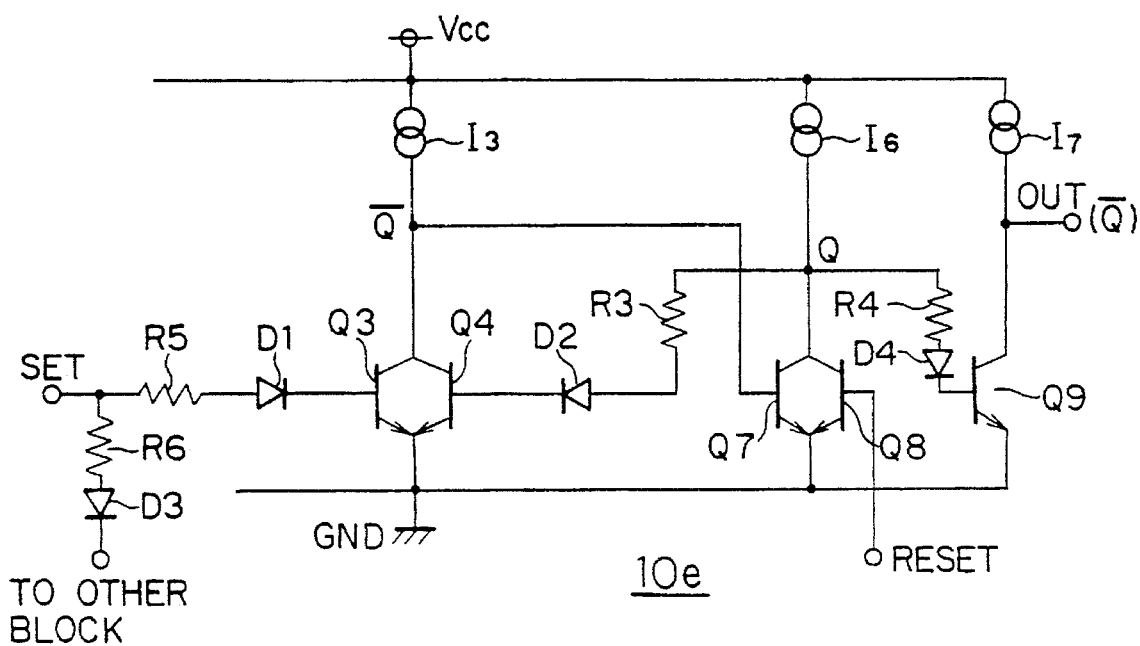
FIG. 5 is a circuit diagram of a fifth embodiment of a semiconductor integrated circuit of a flip-flop circuit according to the present invention.

FIG. 5 is a circuit diagram of a fifth embodiment of a semiconductor integrated bipolar flip-flop circuit according to the present invention. This embodiment of the flip-flop circuit 10e differs from the conventional flip-flop circuit 10 shown in FIG. 9 in that level-shift diodes D1 and D2 serving as elements for preventing turning on of transistors are connected to bases of respective transistors Q3 and Q4 so that the effective threshold voltages Vth of these transistors Q3 and Q4 are increased. Level-shift diodes D3 and D4 are also added so as to recover an imbalance associated with the fan-out of two arising from addition of the level-shift diodes D1 and D2.

With this arrangement, the effective threshold voltages Vth of the common-emitter transistors Q3 and Q4 can be increased by a factor of about two (from a common value of about 0.65 V to about 1.3 V). As a result, the flip-flop circuit has greater resistance to noise.

EMBODIMENT 6

Figure 6:
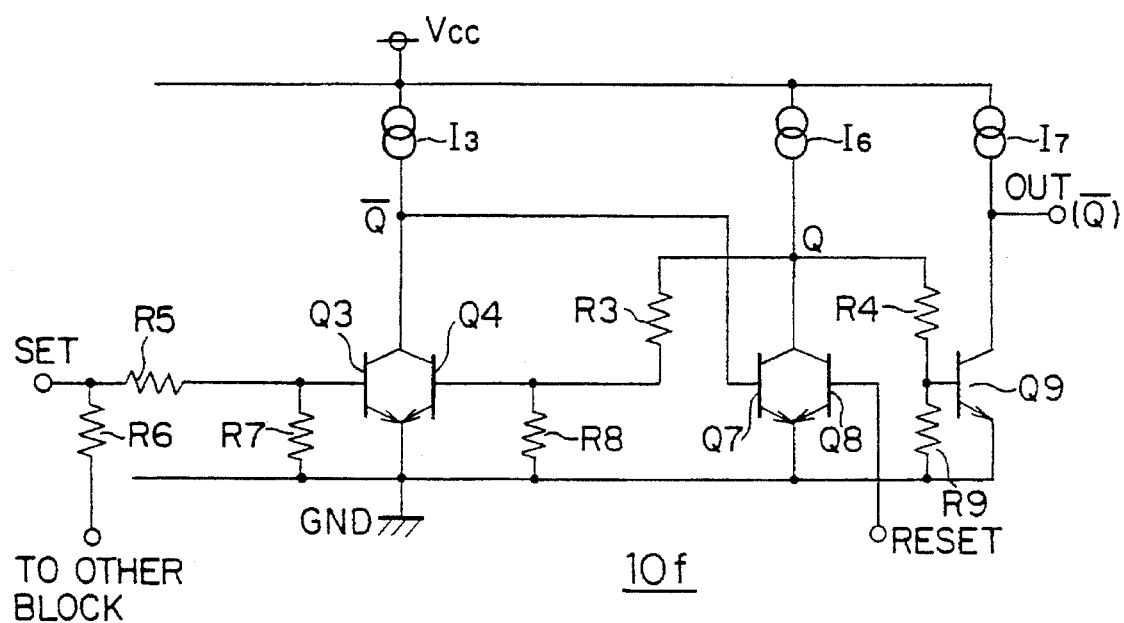
FIG. 6 is a circuit diagram of a sixth embodiment of a semiconductor integrated circuit of a flip-flop circuit according to the present invention.

FIG. 6 is a circuit diagram of a sixth embodiment of a semiconductor integrated bipolar flip-flop circuit according to the present invention. This embodiment of the flip-flop circuit 10f differs from the conventional flip-flop circuit 10 shown in FIG. 9 in that leakage reducing resistors R7 and R8 serving as elements for preventing turning on of transistors are added between each base and emitter of respective transistors Q3 and Q4 so that noise currents cannot easily reach the transistors Q3 and Q4. A leakage reducing resistor R9 is also added between the base and the emitter of the transistor Q9 so as to recover an imbalance between two loads of the 2-fan-out arising from the additions of the resistors R7 and R8.

EMBODIMENT 7

Figure 7:
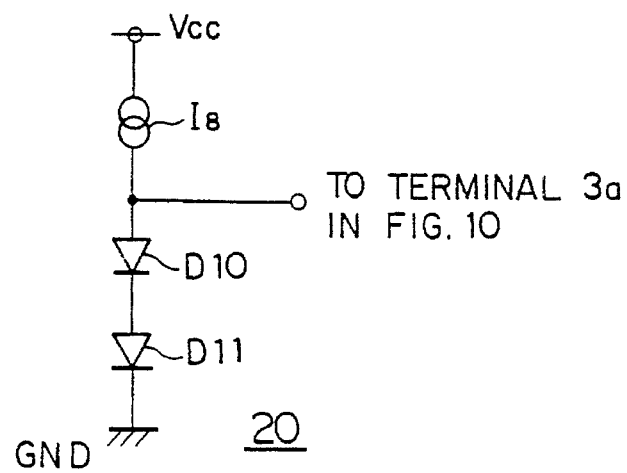
FIG. 7 is a circuit diagram of a seventh embodiment of a stabilized voltage source according to the present invention, wherein the stabilized voltage source is connected to a power supply terminal formed in an epitaxial layer on a semiconductor substrate of a semiconductor integrated circuit.
Figure 10:
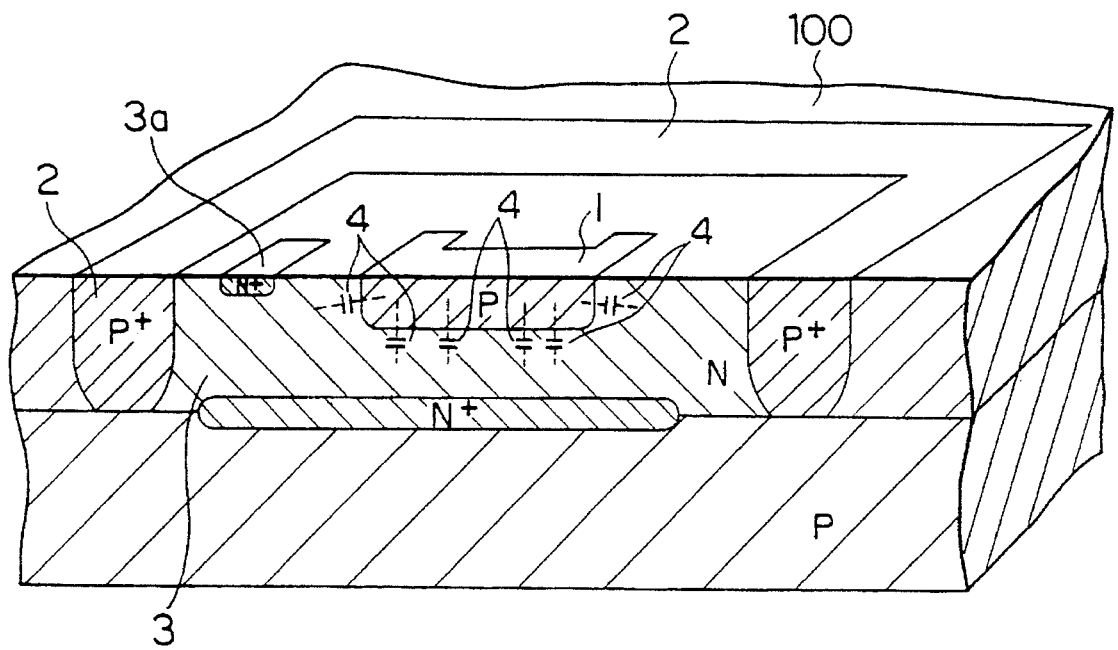
FIG. 10 is a cross-sectional view of a semiconductor substrate of the conventional semiconductor integrated circuit wherein p-type diffused resistors are formed on the semiconductor substrate.
Figure 11A:
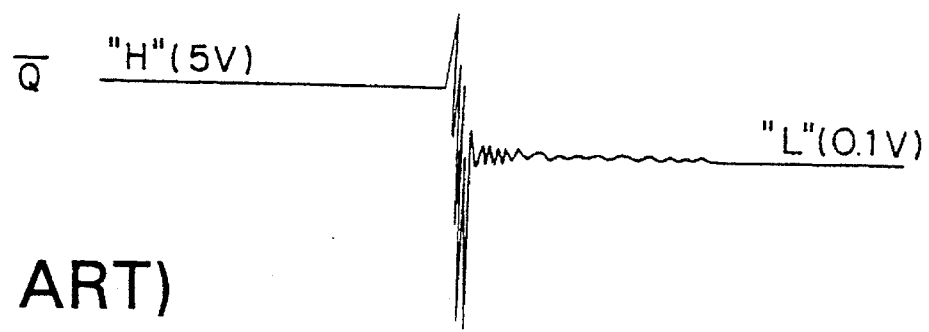
FIGS. 11A and 11B are schematic illustrations of a waveform of an output of a flip-flop circuit and a waveform of a power supply voltage both including noise components that cause erroneous operations of the flip-flop circuit according to a conventional technique of a semiconductor integrated circuit.
Figure 11B:
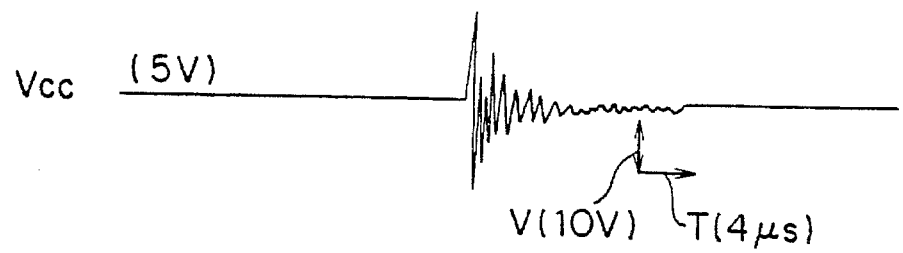

FIG. 7 is a circuit diagram of a seventh embodiment of a stabilized voltage source 20 according to the present invention, wherein the stabilized voltage source 20 is connected to a power supply terminal (for example, the power supply terminal 3a of the epitaxial layer 3 in FIG. 10) of an epitaxial layer on a semiconductor substrate of a semiconductor integrated circuit wherein p-type diffused resistors are located in the epitaxial layer. In this embodiment, a flip-flop circuit is configured in the same manner as in the flip-flop circuit 10 shown in FIG. 9. However, the electric power is supplied indirectly by the power supply Vcc via the stabilized voltage source shown in FIG. 7 that provides a voltage equal to a forward voltage (about 1.3 V) of a series connection of two voltage-stabilizing diodes D10 and D11 to the epitaxial layer (the p-type diffused island) in which the resistors R3 and R5 connected to the bases of the transistors Q3 and Q4 are located. With this arrangement, even if voltage fluctuations occur in the power supply Vcc, the stabilized voltage source 20 can provide a stabilized voltage of 1.3 V. As a result, noise currents cannot easily flow through parasitic capacitances associated with the p-type diffused resistors.

The number of voltage-stabilizing diodes is not limited to two. An arbitrary number, for example three or more, voltage-stabilizing diodes may be employed to achieve a required supply voltage.

EMBODIMENT 8

Figure 8:
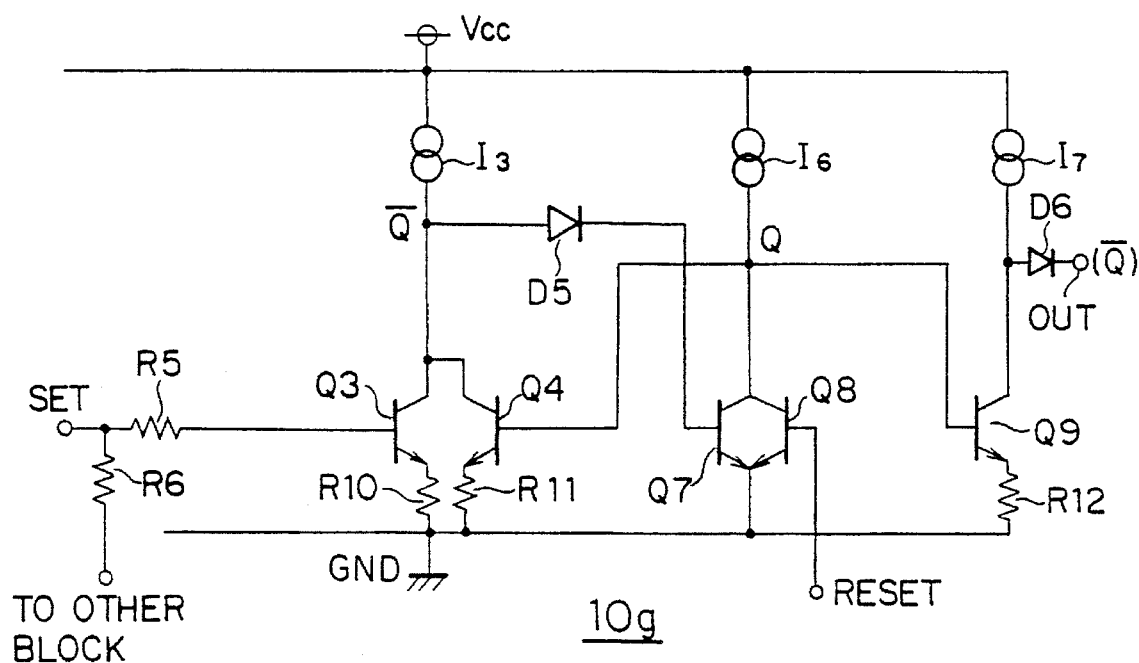
FIG. 8 is a circuit diagram of an eighth embodiment of a semiconductor integrated circuit of a flip-flop circuit according to the present invention.

FIG. 8 is a circuit diagram of an eighth embodiment of a semiconductor integrated bipolar flip-flop circuit according to the present invention. This embodiment of the flip-flop circuit 10g differs from the conventional flip-flop circuit 10 shown in FIG. 9 in that resistors R10 and R11 are connected between each emitter of transistors Q3 and Q4 and ground so that these resistors act as balance resistors for the Q signal having a fan-out of two or more. A resistor R12 is also added between the emitter of the transistor Q9 and ground so as to maintain the balance between the transistors Q4 and Q9. Furthermore, a level-shift diode D5 is added between the collector of the transistor Q4 and the base of the transistor Q7 so a transistor at a succeeding stage can turn off when emitters of the transistors Q3 and Q4 come to floating potentials. For a similar reason, a diode D6 is also connected to the output terminal OUT.

EMBODIMENT 9

A ninth embodiment described below may be applied to any previous embodiment in such a manner that currents supplied by the constant current sources I3 and I6 to transistors that are directly involved with the set or reset operation of the flip-flop circuit. The collector currents of these transistors, are set to values greater than noise currents for greater resistance to noise. In general, the constant current sources I1–I7 are designed to supply a constant current of, for example, several tens of μA. In this embodiment, however, the currents supplied by the constant current sources I3 and I6 are set to several mA so that even if a noise current of several A flows into a transistor, for example, the transistor Q3, the transistor Q3 will never turn on provided that the transistor has a current gain hFE of about 100. In this way, erroneous operations of the flip-flop circuit are prevented.

Although the present invention has been illustrated in terms of specific examples, the invention is not meant to be limited to these embodiments. For example, various combinations of these embodiments or other modifications are possible.

Furthermore, the applications of the present invention are not limited to semiconductor integrated circuits installed in cars or motorcycles. The present invention can also be applied to various semiconductor integrated circuits including a flip-flop circuit that is subjected to large noise signals.

As described above, in a semiconductor integrated circuit including a flip-flop circuit according to the present invention, a p-type diffused resistor is not connected directly to bases of transistors that are directly involved with at least either a set operation or a reset operation of the flip-flop circuit, or there is provided means for suppressing a noise current passing through a parasitic capacitance associated with the p-type diffused resistor, thereby preventing the transistors from turning on erroneously. Thus, the present invention provides a high-reliability semiconductor integrated circuit that has high resistance to noise.

What is claimed is:

1. A semiconductor integrated flip-flop circuit with bipolar transistors comprising:

a set/reset circuit section for generating a Q output signal and an inverted-Q output signal, the set/reset circuit section including a plurality of bipolar transistors having respective emitters, bases, and collectors, the transistors performing set and reset operations of the flip-flop circuit; and erroneous operation suppressing means for suppressing erroneous operation of a first of the transistors due to noise entering the bases of the transistors, wherein the first transistor has its base coupled to a signal output having a fan-out of at least two and is latched in an on-state or an off-state, the erroneous operation suppressing means including a two-stage bipolar transistor inverter circuit and a balance resistor, the two-stage bipolar transistor inverter circuit being coupled between the base of the first transistor and the balance resistor, the balance resistor being coupled to the signal output.

2. The semiconductor integrated flip-flop circuit with bipolar transistors according to claim 1 wherein said erroneous operation suppressing means comprises a turn-on suppressing resistor for suppressing turning-on of the first transistor and the turn-on suppressing resistor is connected between the base of one transistor of the two-stage bipolar transistor inverter circuit and the collector of another transistor of the two-stage bipolar inverter circuit.

3. The semiconductor integrated flip-flop circuit with bipolar transistors according to claim 1 wherein the semiconductor integrated circuit comprises a signal inverting section for inverting an output signal from the set/reset circuit section.

* * * * *